United States Patent
deVilliers

(10) Patent No.: US 10,151,981 B2
(45) Date of Patent: Dec. 11, 2018

(54) METHODS OF FORMING STRUCTURES SUPPORTED BY SEMICONDUCTOR SUBSTRATES

(75) Inventor: Anton deVilliers, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 266 days.

(21) Appl. No.: 12/125,725

(22) Filed: May 22, 2008

(65) Prior Publication Data

US 2009/0291397 A1  Nov. 26, 2009

(51) Int. Cl.
G03F 7/26 (2006.01)
G03F 7/40 (2006.01)
H01L 21/033 (2006.01)

(52) U.S. Cl.
CPC .......... G03F 7/40 (2013.01); H01L 21/0337 (2013.01)

(58) Field of Classification Search
CPC ....... G03F 7/0035; G03F 7/40; H01L 21/0337
USPC .......................................... 430/311, 319, 313
See application file for complete search history.

(56) References Cited

U.S. PATENT DOCUMENTS

| | | |
|---|---|---|
| 4,910,168 A | 3/1990 | Tsai |
| 5,008,207 A | 4/1991 | Blouse et al. |
| 5,013,680 A | 5/1991 | Lowrey et al. |
| 5,047,117 A | 9/1991 | Roberts |
| 5,254,218 A | 10/1993 | Roberts et al. |
| 5,328,810 A | 7/1994 | Lowery et al. |
| 5,372,916 A | 12/1994 | Ogawa et al. |
| 5,382,315 A | 1/1995 | Kumar |
| 5,420,067 A | 5/1995 | Hsu |
| 5,429,988 A | 7/1995 | Huang et al. |

(Continued)

FOREIGN PATENT DOCUMENTS

| | | |
|---|---|---|
| CN | 1550889 | 12/2004 |
| CN | 1761063 | 4/2006 |

(Continued)

OTHER PUBLICATIONS

A Flexible Gate Array Architecture for High-speed and High-Density Applications; Mar. 1996 Gallia et al.; 430-436.

(Continued)

*Primary Examiner* — Brittany L Raymond
(74) *Attorney, Agent, or Firm* — Wells St. John P.S.

(57) ABSTRACT

Some embodiments include methods of forming structures supported by semiconductor substrates. Radiation-imageable material may be formed over a substrate and patterned into at least two separated features. A second material may be formed over the features and across one or more gaps between the features. At least one substance may be released from the features and utilized to alter a portion of the second material. The altered portion of the second material may be selectively removed relative to another portion of the second material which is not altered. Also, the features of radiation-imageable material may be selectively removed relative to the altered portion of the second material. The second material may contain one or more inorganic components dispersed in an organic composition. The substance released from the features of radiation-imageable material may be acid which forms cross-links within such organic composition, an hydroxyl, or any other suitable substance.

19 Claims, 6 Drawing Sheets

(56) References Cited

U.S. PATENT DOCUMENTS

| | | |
|---|---|---|
| 5,573,837 A | 11/1996 | Roberts et al. |
| 5,593,813 A | 1/1997 | Kim |
| 5,616,510 A | 4/1997 | Wong |
| 5,905,279 A | 5/1999 | Nitayama et al. |
| 5,916,821 A | 6/1999 | Kerber |
| 6,063,688 A | 5/2000 | Doyle et al. |
| 6,087,263 A | 7/2000 | Clampitt et al. |
| 6,140,217 A | 10/2000 | Jones et al. |
| 6,174,818 B1 | 1/2001 | Tao et al. |
| 6,207,490 B1 | 3/2001 | Lee |
| 6,235,574 B1 | 5/2001 | Tobben et al. |
| 6,249,335 B1 | 6/2001 | Hirukawa et al. |
| 6,303,272 B1 | 10/2001 | Furukawa et al. |
| 6,352,932 B1 | 3/2002 | Clampitt et al. |
| 6,383,952 B1* | 5/2002 | Subramanian et al. ...... 438/781 |
| 6,429,123 B1 | 8/2002 | Tseng |
| 6,455,433 B1 | 9/2002 | Chang et al. |
| 6,483,136 B1 | 11/2002 | Makoto et al. |
| 6,545,904 B2 | 4/2003 | Tran |
| 6,548,385 B1 | 4/2003 | Lai |
| 6,548,401 B1 | 4/2003 | Trivedi |
| 6,566,280 B1 | 5/2003 | Meagley et al. |
| 6,580,136 B2 | 6/2003 | Mandelman et al. |
| 6,599,844 B2 | 7/2003 | Koh et al. |
| 6,605,541 B1 | 8/2003 | Yu |
| 6,627,524 B2 | 9/2003 | Scott |
| 6,630,379 B2 | 10/2003 | Mandelman et al. |
| 6,638,441 B2 | 10/2003 | Chang et al. |
| 6,649,956 B2 | 11/2003 | Makoto et al. |
| 6,667,502 B1 | 12/2003 | Agarwal et al. |
| 6,703,323 B2 | 3/2004 | Kong et al. |
| 6,710,390 B2 | 3/2004 | Parekh et al. |
| 6,734,107 B2 | 5/2004 | Lai et al. |
| 6,735,132 B2 | 5/2004 | Siek |
| 6,753,220 B2 | 6/2004 | Jeungling |
| 6,756,619 B2 | 6/2004 | Tran |
| 6,774,051 B2 | 8/2004 | Chung et al. |
| 6,811,817 B2 | 11/2004 | Sugeta et al. |
| 6,826,069 B2 | 11/2004 | Kurjanowicz et al. |
| 6,864,184 B1 | 3/2005 | Gabriel |
| 6,872,512 B2 | 3/2005 | Yamashita |
| 6,893,972 B2 | 5/2005 | Rottstegge et al. |
| 6,905,975 B2 | 6/2005 | Boettiger et al. |
| 6,916,594 B2 | 7/2005 | Bok |
| 6,951,822 B2 | 10/2005 | Scholz |
| 6,977,404 B2 | 12/2005 | Katsumata et al. |
| 7,023,069 B2 | 4/2006 | Blanchard |
| 7,037,840 B2 | 5/2006 | Katz |
| 7,042,038 B2 | 5/2006 | Makoto et al. |
| 7,049,652 B2 | 5/2006 | Mokhlesi et al. |
| 7,064,376 B2 | 6/2006 | Shau |
| 7,067,385 B2 | 6/2006 | Manning |
| 7,074,533 B2 | 7/2006 | Fuller et al. |
| 7,098,105 B2 | 8/2006 | Juengling |
| 7,115,525 B2 | 10/2006 | Abatchev et al. |
| 7,125,781 B2 | 10/2006 | Manning et al. |
| 7,151,040 B2 | 12/2006 | Tran et al. |
| 7,166,533 B2 | 1/2007 | Happ |
| 7,199,005 B2 | 4/2007 | Sandhu et al. |
| 7,202,127 B2 | 4/2007 | Musch et al. |
| 7,202,174 B1 | 4/2007 | Jung |
| 7,230,292 B2 | 6/2007 | Graettinger |
| 7,253,118 B2 | 8/2007 | Tran et al. |
| 7,265,059 B2 | 9/2007 | Rao et al. |
| 7,271,108 B2 | 9/2007 | Sadjadi |
| 7,314,810 B2 | 1/2008 | Jung et al. |
| 7,320,911 B2 | 1/2008 | Basceri et al. |
| 7,339,252 B2 | 3/2008 | Blanchard |
| 7,361,609 B2 | 4/2008 | Hah et al. |
| 7,384,849 B2 | 6/2008 | Parekh et al. |
| 7,387,939 B2 | 6/2008 | Manning |
| 7,390,749 B2 | 6/2008 | Kim et al. |
| 7,390,750 B1 | 6/2008 | Ramkumar et al. |
| 7,396,781 B2 | 7/2008 | Wells |
| 7,439,152 B2 | 10/2008 | Manning |
| 7,442,976 B2 | 10/2008 | Juengling |
| 7,517,753 B2 | 4/2009 | Manning |
| 7,521,371 B2 | 4/2009 | DeBruler |
| 7,521,378 B2 | 4/2009 | Fucsko et al. |
| 7,524,607 B2 | 4/2009 | Ho et al. |
| 7,537,866 B2 | 5/2009 | King Liu |
| 7,544,563 B2 | 6/2009 | Manning |
| 7,553,760 B2 | 6/2009 | Yang et al. |
| 7,557,013 B2 | 7/2009 | Bhat et al. |
| 7,557,015 B2 | 7/2009 | Sandhu et al. |
| 7,582,412 B2 | 9/2009 | Cameron et al. |
| 7,651,951 B2 | 1/2010 | Tran et al. |
| 7,682,924 B2 | 3/2010 | Bhat et al. |
| 7,687,387 B2 | 3/2010 | Inaba et al. |
| 7,696,076 B2 | 4/2010 | Jung et al. |
| 7,713,818 B2 | 5/2010 | Chan |
| 7,754,591 B2 | 7/2010 | Jung |
| 7,790,357 B2 | 9/2010 | Jung |
| 7,790,360 B2 | 9/2010 | Alapati et al. |
| 7,807,575 B2 | 10/2010 | Zhou |
| 7,842,601 B2 | 11/2010 | Lee et al. |
| 7,846,646 B2 | 12/2010 | Akifumi |
| 7,851,135 B2 | 12/2010 | Jung et al. |
| 7,855,038 B2 | 12/2010 | Hah et al. |
| 7,897,460 B2 | 3/2011 | Parekh et al. |
| 7,902,074 B2 | 3/2011 | Niroomand et al. |
| 7,923,371 B2 | 4/2011 | Shinohe |
| 8,012,675 B2 | 9/2011 | Yang |
| 8,067,286 B2 | 11/2011 | Parekh et al. |
| 8,083,953 B2 | 12/2011 | Millward et al. |
| 8,083,958 B2 | 12/2011 | Li et al. |
| 8,129,289 B2 | 3/2012 | Smythe et al. |
| 8,148,052 B2 | 4/2012 | Vanleenhov et al. |
| 8,247,302 B2 | 8/2012 | Sills |
| 8,273,634 B2 | 9/2012 | Sills |
| 8,338,304 B2 | 12/2012 | Zhou |
| 8,440,576 B2 | 5/2013 | Hong |
| 8,575,032 B2 | 11/2013 | Light et al. |
| 8,629,048 B1 | 1/2014 | Sipani et al. |
| 8,629,527 B2 | 1/2014 | Parekh et al. |
| 8,796,155 B2 | 8/2014 | Sills |
| 8,852,851 B2 | 10/2014 | Zhou et al. |
| 9,761,457 B2 | 9/2017 | Zhou et al. |
| 2002/0037617 A1 | 3/2002 | Kim et al. |
| 2002/0043690 A1 | 4/2002 | Doyle et al. |
| 2002/0094688 A1 | 7/2002 | Mitsuiki |
| 2002/0130348 A1 | 9/2002 | Tran |
| 2002/0142603 A1 | 10/2002 | Chang et al. |
| 2003/0001214 A1 | 1/2003 | Makoto et al. |
| 2003/0006410 A1 | 1/2003 | Doyle |
| 2003/0008969 A1 | 1/2003 | Sugeta et al. |
| 2003/0091936 A1 | 5/2003 | Rottstegge et al. |
| 2003/0096903 A1 | 5/2003 | Sugeta et al. |
| 2004/0043546 A1 | 3/2004 | Makoto et al. |
| 2004/0198065 A1 | 10/2004 | Lee et al. |
| 2004/0253535 A1 | 12/2004 | Cameron et al. |
| 2005/0058950 A1 | 3/2005 | Sugeta et al. |
| 2005/0069813 A1* | 3/2005 | Sawada ............ G03F 7/40 430/311 |
| 2005/0130068 A1* | 6/2005 | Kondoh et al. ............ 430/312 |
| 2005/0142497 A1 | 6/2005 | Ryou et al. |
| 2005/0164478 A1 | 7/2005 | Chan et al. |
| 2005/0173740 A1 | 8/2005 | Jim |
| 2005/0214683 A1 | 9/2005 | Eiichi et al. |
| 2005/0215040 A1 | 9/2005 | Doyle |
| 2005/0255696 A1 | 11/2005 | Makiyama et al. |
| 2005/0272220 A1 | 12/2005 | Waldfried et al. |
| 2006/0011947 A1 | 1/2006 | Juengling |
| 2006/0024621 A1 | 2/2006 | Nolscher et al. |
| 2006/0046200 A1 | 3/2006 | Abatchev et al. |
| 2006/0046422 A1 | 3/2006 | Tran |
| 2006/0046484 A1 | 3/2006 | Abatchev et al. |
| 2006/0063384 A1 | 3/2006 | Hah et al. |
| 2006/0088788 A1 | 4/2006 | Kudo et al. |
| 2006/0099347 A1 | 5/2006 | Sugeta et al. |
| 2006/0115978 A1 | 6/2006 | Specht |
| 2006/0118785 A1 | 6/2006 | Allen et al. |
| 2006/0154182 A1 | 7/2006 | Brodsky |
| 2006/0240361 A1 | 10/2006 | Lee et al. |

(56) References Cited

U.S. PATENT DOCUMENTS

| | | |
|---|---|---|
| 2006/0262511 A1 | 11/2006 | Abatchev et al. |
| 2006/0263699 A1 | 11/2006 | Abatchev et al. |
| 2006/0273456 A1 | 12/2006 | Sant et al. |
| 2006/0278911 A1 | 12/2006 | Eppich |
| 2006/0281266 A1 | 12/2006 | Wells |
| 2006/0286795 A1 | 12/2006 | Yosho |
| 2007/0003878 A1 | 1/2007 | Paxton et al. |
| 2007/0010058 A1 | 1/2007 | Juengling |
| 2007/0020565 A1 | 1/2007 | Koh et al. |
| 2007/0023805 A1 | 2/2007 | Wells et al. |
| 2007/0026684 A1 | 2/2007 | Parascandola et al. |
| 2007/0037066 A1 | 2/2007 | Hsiao |
| 2007/0045712 A1 | 3/2007 | Haller et al. |
| 2007/0048674 A1 | 3/2007 | Wells |
| 2007/0048930 A1 | 3/2007 | Figura et al. |
| 2007/0049003 A1 | 3/2007 | Smythe |
| 2007/0049011 A1 | 3/2007 | Tran |
| 2007/0049030 A1 | 3/2007 | Sandhu et al. |
| 2007/0049035 A1 | 3/2007 | Makoto et al. |
| 2007/0049040 A1 | 3/2007 | Bai et al. |
| 2007/0077524 A1 | 4/2007 | Koh et al. |
| 2007/0077743 A1 | 4/2007 | Rao et al. |
| 2007/0085152 A1 | 4/2007 | Butler et al. |
| 2007/0096182 A1 | 5/2007 | Schloesser et al. |
| 2007/0099431 A1 | 5/2007 | Li |
| 2007/0105357 A1 | 5/2007 | Nejad et al. |
| 2007/0123015 A1 | 5/2007 | Chinthakindi et al. |
| 2007/0145464 A1 | 6/2007 | Voshnell et al. |
| 2007/0148984 A1 | 6/2007 | Abatchev et al. |
| 2007/0161251 A1 | 7/2007 | Tran et al. |
| 2007/0181929 A1 | 8/2007 | Juengling |
| 2007/0190463 A1 | 8/2007 | Sandhu et al. |
| 2007/0197014 A1 | 8/2007 | Jeon et al. |
| 2007/0202671 A1 | 8/2007 | Jung |
| 2007/0202697 A1 | 8/2007 | Jung |
| 2007/0205438 A1 | 9/2007 | Juengling |
| 2007/0205443 A1 | 9/2007 | Juengling |
| 2007/0224537 A1 | 9/2007 | Nozaki et al. |
| 2007/0238053 A1 | 10/2007 | Hashimoto |
| 2007/0238299 A1 | 10/2007 | Niroomand et al. |
| 2007/0248916 A1 | 10/2007 | Kamijima |
| 2007/0261016 A1 | 11/2007 | Sandhu et al. |
| 2007/0264828 A1 | 11/2007 | Jung et al. |
| 2007/0264830 A1 | 11/2007 | Huang et al. |
| 2007/0278183 A1 | 12/2007 | Lee et al. |
| 2007/0281219 A1 | 12/2007 | Sandhu |
| 2007/0281488 A1 | 12/2007 | Wells et al. |
| 2007/0281493 A1 | 12/2007 | Fucsko et al. |
| 2008/0002475 A1 | 1/2008 | Yang et al. |
| 2008/0008969 A1 | 1/2008 | Zhou et al. |
| 2008/0026327 A1 | 1/2008 | Koo |
| 2008/0032243 A1 | 2/2008 | Jung |
| 2008/0032508 A1 | 2/2008 | Chang |
| 2008/0044770 A1* | 2/2008 | Nozaki et al. ............... 430/311 |
| 2008/0057692 A1 | 3/2008 | Wells et al. |
| 2008/0063986 A1 | 3/2008 | Jung |
| 2008/0064213 A1 | 3/2008 | Jung |
| 2008/0070165 A1 | 3/2008 | Fischer et al. |
| 2008/0076070 A1 | 3/2008 | Koh et al. |
| 2008/0085612 A1 | 4/2008 | Smythe et al. |
| 2008/0090416 A1 | 4/2008 | Rahu et al. |
| 2008/0113483 A1 | 5/2008 | Wells |
| 2008/0113511 A1 | 5/2008 | Park et al. |
| 2008/0122125 A1 | 5/2008 | Zhou |
| 2008/0171438 A1 | 7/2008 | Sinha et al. |
| 2008/0171446 A1 | 7/2008 | Kim et al. |
| 2008/0176152 A1 | 7/2008 | Hah et al. |
| 2008/0176406 A1 | 7/2008 | Ikeda et al. |
| 2008/0193658 A1 | 8/2008 | Millward |
| 2008/0199806 A1 | 8/2008 | Hatakeyama et al. |
| 2008/0199814 A1 | 8/2008 | Brzozowy et al. |
| 2008/0206950 A1 | 8/2008 | Bhat et al. |
| 2008/0220600 A1 | 9/2008 | Alapati et al. |
| 2008/0254627 A1 | 10/2008 | Wells |
| 2008/0261349 A1 | 10/2008 | Abatchev |
| 2008/0292991 A1 | 11/2008 | Wallow |
| 2008/0120900 A1 | 12/2008 | Wojtczak et al. |
| 2008/0296732 A1 | 12/2008 | Olson |
| 2008/0305636 A1 | 12/2008 | Kim et al. |
| 2009/0011374 A1 | 1/2009 | Chang et al. |
| 2009/0074958 A1 | 3/2009 | Xiao |
| 2009/0108415 A1 | 4/2009 | Lenski et al. |
| 2009/0117739 A1 | 5/2009 | Shin et al. |
| 2009/0130601 A1 | 5/2009 | Jeon |
| 2009/0130612 A1 | 5/2009 | Yang |
| 2009/0130852 A1 | 5/2009 | Kewley |
| 2009/0212016 A1* | 8/2009 | Cheng et al. ............... 216/67 |
| 2009/0214823 A1 | 8/2009 | Cheng et al. |
| 2009/0291397 A1 | 11/2009 | deVilliers |
| 2009/0298274 A1 | 12/2009 | Kajiwara |
| 2010/0009512 A1 | 1/2010 | Fishburn |
| 2010/0021573 A1 | 1/2010 | Gonzalez et al. |
| 2010/0028809 A1 | 2/2010 | Vanleenhove et al. |
| 2010/0040980 A1 | 2/2010 | Eiichi et al. |
| 2010/0068656 A1 | 3/2010 | Yeh et al. |
| 2010/0081265 A1 | 4/2010 | Mashita et al. |
| 2010/0093175 A1 | 4/2010 | Niroomand et al. |
| 2010/0124826 A1 | 5/2010 | Millward et al. |
| 2010/0129980 A1 | 5/2010 | Sandhu et al. |
| 2010/0130015 A1 | 5/2010 | Nakajima et al. |
| 2010/0130016 A1 | 5/2010 | deVilliers |
| 2010/0144150 A1 | 6/2010 | Sills et al. |
| 2010/0144151 A1 | 6/2010 | Sills et al. |
| 2010/0144153 A1 | 6/2010 | Sills et al. |
| 2010/0203740 A1 | 8/2010 | Li |
| 2011/0018055 A1 | 1/2011 | Ohta et al. |
| 2011/0127677 A1 | 6/2011 | Konishi |
| 2011/0147984 A1 | 6/2011 | Cheng et al. |
| 2013/0009283 A1 | 1/2013 | Zhou |
| 2013/0078574 A1 | 3/2013 | Peeters et al. |

FOREIGN PATENT DOCUMENTS

| | | |
|---|---|---|
| CN | 1752844 | 7/2007 |
| CN | 101026087 | 8/2007 |
| CN | 101145515 | 3/2008 |
| CN | 200980148546.9 | 11/2012 |
| CN | 200980148548.8 | 2/2013 |
| CN | 200980148590.X | 2/2013 |
| CN | 201080013110.1 | 5/2013 |
| CN | 201410270158.0 | 5/2016 |
| EP | 0171111 A2 | 2/1986 |
| EP | 1273974 | 1/2003 |
| EP | 1376242 * | 1/2004 |
| EP | 09830819.0 | 3/2013 |
| EP | 10756541.8 | 5/2013 |
| EP | 09830817.7 | 6/2013 |
| EP | 09830818.2 | 7/2013 |
| EP | 09830820.8 | 8/2013 |
| JP | 56046531 A2 | 4/1981 |
| JP | 58157135 A2 | 9/1983 |
| JP | 59211231 A2 | 11/1984 |
| JP | 64035916 | 7/1989 |
| JP | 1292829 | 11/1989 |
| JP | 3270227 | 12/1991 |
| JP | 06-077180 | 3/1994 |
| JP | 6275577 | 9/1994 |
| JP | 2002-217170 | 8/2002 |
| JP | 2003234279 | 8/2003 |
| JP | 2007-13457 | 4/2004 |
| JP | 2004247399 | 9/2004 |
| JP | 2005-243681 | 9/2005 |
| JP | 2006245625 | 9/2006 |
| JP | 2007-017993 | 1/2007 |
| JP | 2007-294511 | 11/2007 |
| JP | 2007-305976 | 11/2007 |
| JP | 2008-072097 | 3/2008 |
| JP | 2008-072101 | 3/2008 |
| JP | 2009-289974 | 12/2009 |
| KR | 20030049198 | 6/2003 |
| KR | 20030056601 | 7/2003 |
| KR | 20030089063 | 11/2003 |
| KR | 10-2004-0016678 | 2/2004 |
| KR | 4025289 | 3/2004 |

(56) References Cited

FOREIGN PATENT DOCUMENTS

| KR | 20040057582 | 7/2004 |
| KR | 10-2007-0076793 | 7/2007 |
| KR | 10-2007-0122049 | 12/2007 |
| KR | 10-0784062 B1 | 12/2007 |
| KR | 10-2008-0039006 | 5/2008 |
| KR | 2008-0038963 | 5/2008 |
| SG | 201300853-7 | 6/2013 |
| TW | 200702903 | 1/2007 |
| TW | 200818405 | 4/2008 |
| TW | 200834660 | 8/2008 |
| TW | 098113229 | 9/2012 |
| TW | 098139941 | 12/2012 |
| TW | 098139943 | 12/2012 |
| TW | 099140232 | 7/2013 |
| TW | 098139942 | 12/2013 |
| WO | PCT/US2009/063999 | 5/2001 |
| WO | WO 2006/104654 | 10/2006 |
| WO | WO2007/027558 | 3/2007 |
| WO | WO 2008/008338 | 1/2008 |
| WO | WO 2008/059440 | 5/2008 |
| WO | PCT/US2007/015729 | 1/2009 |
| WO | PCT/US2009/063978 | 5/2010 |
| WO | PCT/US2009/063999 | 5/2010 |
| WO | PCT/US2009/064004 | 5/2010 |
| WO | PCT/US2010/025495 | 9/2010 |
| WO | PCT/US2009/039793 | 11/2010 |
| WO | PCT/US2009/041500 | 12/2010 |
| WO | PCT/US2009/063978 | 6/2011 |
| WO | PCT/US2009/063999 | 6/2011 |
| WO | PCT/US2009/064004 | 6/2011 |
| WO | PCT/US2010/055488 | 6/2011 |
| WO | PCT/US2010/025495 | 9/2011 |
| WO | PCT/US2010/055488 | 6/2012 |

OTHER PUBLICATIONS

PCT/US2009/039793; Search Report dated Oct. 30, 2009; 4 pp.
PCT/US2009/039793; Written Opinion dated Oct. 30, 2009; 5 pp.
PCT/US2009/041500; Search Report dated Dec. 7, 2009; 3 pp.
PCT/US2009/041500; Written Opinion dated Dec. 7, 2009; 3 pp.
PCT/US2007/015729; Search Report dated Jan. 2, 2008; 3 pp.
PCT/US2007/015729; Written Opinion dated Jan. 2, 2008; 7 pp.
Innovative Solutions to Enhance the Legacy Equipments Towards "One Generation ahead" in Flip chip BGA 0.8mm Ball Pitch Technology; Sep. 2005; Ee et al.; 4 pp.
Polysilazane SODs Spinful 400 Series for STI/PMD Application; Clariant; At least as early as Oct. 19, 2009; 1 pp.
Advanced cell Structures for Dynamic RAMs; Jan. 1989; Lu; pp. 27-36.
U.S. Appl. No. 12/328,435, dated Dec. 4, 2008, Sills et al.
U.S. Appl. No. 12/328,448, dated Dec. 4, 2008, Sills et al.
U.S. Appl. No. 12/328,464, dated Dec. 4, 2008, Sills et al.
Terai, Mamoru, et al. "Newly developed RELACS process and materials for 65 nm node device and beyond" website: ieeexplore.ieee.org/iel5/10631/33565/01595193.pdf, pp. 20-21.
Pease, R. Fabian, et al. "Lithography and Other Patterning Techniques for Future Electronics" Proceedings of the IEEE/vol. 96, No. 2, Feb. 2008, pp. 248-270.
Fritze, Michael, et al. "Enhanced Resolution for Future Fabrication" IEEE Circuits & Devices Magazine, Jan. 2003, pp. 43-47.
Owa, Soichi, et al. "Immersion Lithography Ready for 45 nm Manufacturing and Beyond" 2007 IEEE/SEMI Advanced Semiconductor Manufacturing Conference, pp. 238-244.
Liau, C.Y., et al. "Softbake and Post-exposure Bake Optimization for Process Window Improvement and Optical Proximity Effect Tuning" ICSE 2006 Proc. 2006, Kuala Lumpur, Malaysia, 7 pages.
Tan, Hua, et al. "Current Status of Nanonex Nanoimprint Solutions" website: www.nanonex.com/technology.htm 2004, 9 pages.
U.S. Appl. No. 11/714,378, filed Mar. 5, 2007 entitled "Semiconductor Constructions, Methods of Forming Multiple Lines, and Methods of Forming High Density Structures and Low Density Structures with a Single Photomask" 34 pages; Preliminary Amendment filed Mar. 5, 2007 13 pages.
W. H-L. Ma, Plasma Resist Image Stabilizaion Technique (PRIST) IEEE 1980, pp. 574-575.
Masafumi Hori, et al. "Sub-40nm Half-Pitch Double Patterning with Resist Freezing Process" Proc. of SPIE vol. 6923 (2008) pp. 69230H-1-69230H-8.
Doo-Youl Lee, et al. "Double-Patterning Technique Using Plasma Treatment of Photoresist" Japanese Journal of Applied Physics, vol. 46, No. 9B, 2007, pp. 6135-6139.
U.S. Appl. No. 13/101,485, dated May 5, 2011, Light.
0.1μm Level Contact Hole Pattern Formation with KrF Lithography by Resolution Enhancement Lithography Assistedby Chemical Shrink (RELACS); Toyoshima et al.; IEEE; 1998; pp. 12.5.1-12.5.4.

\* cited by examiner

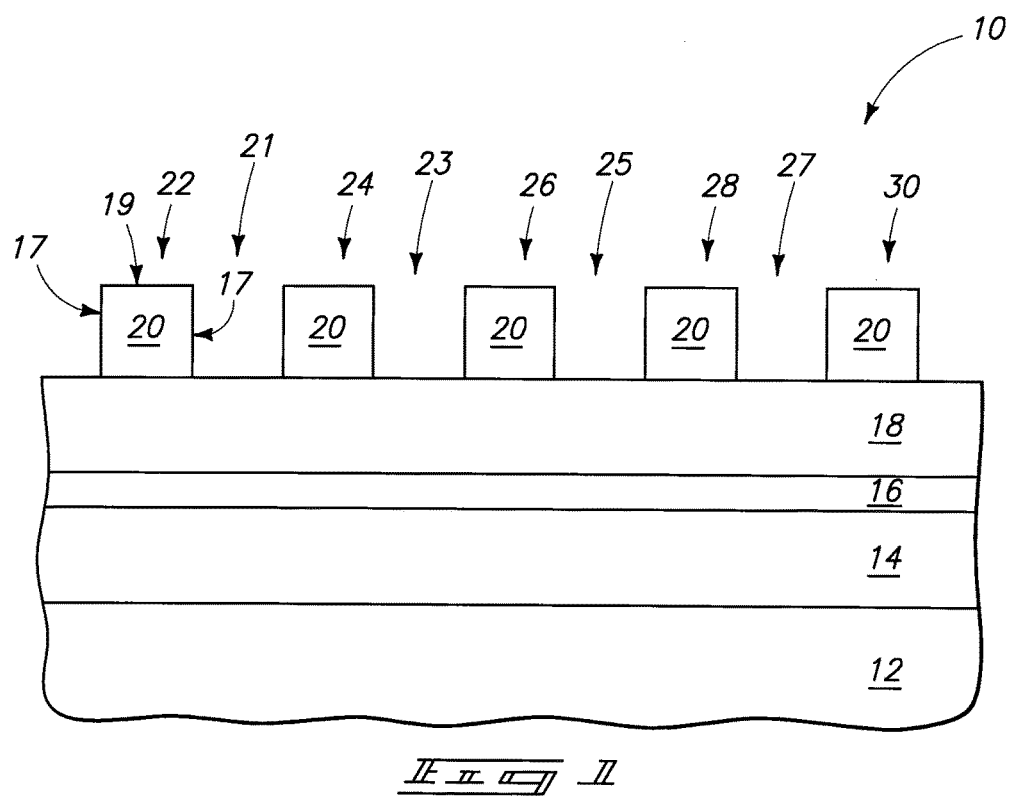
_FIG. 1_
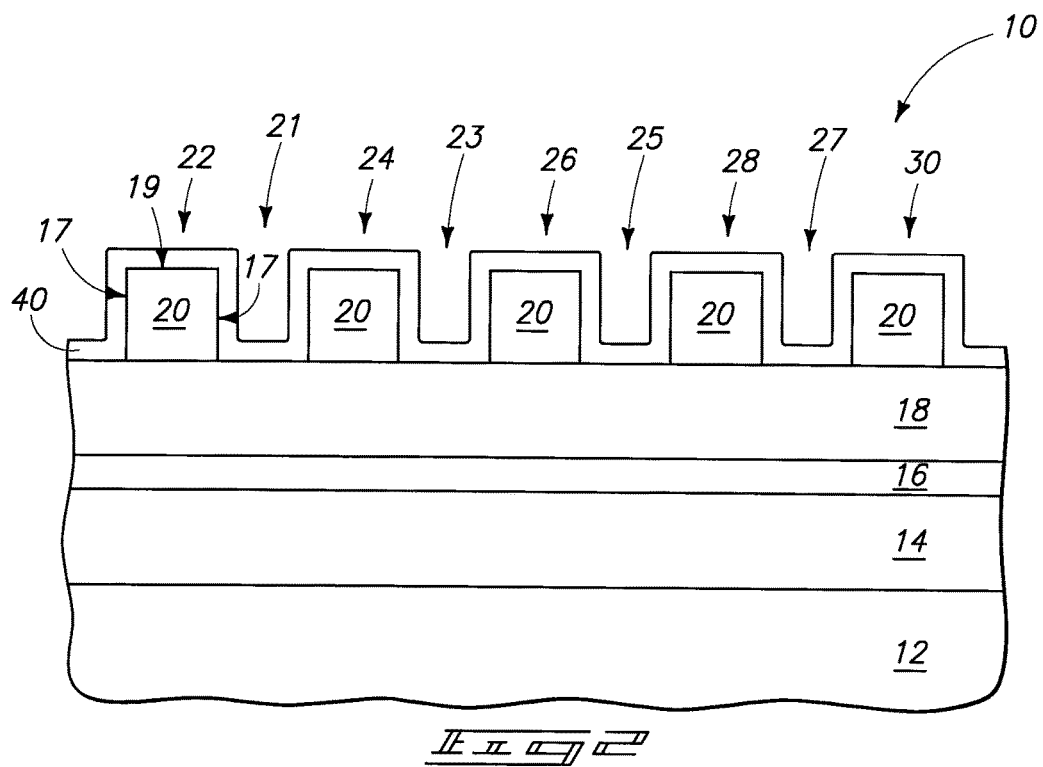
_FIG. 2_

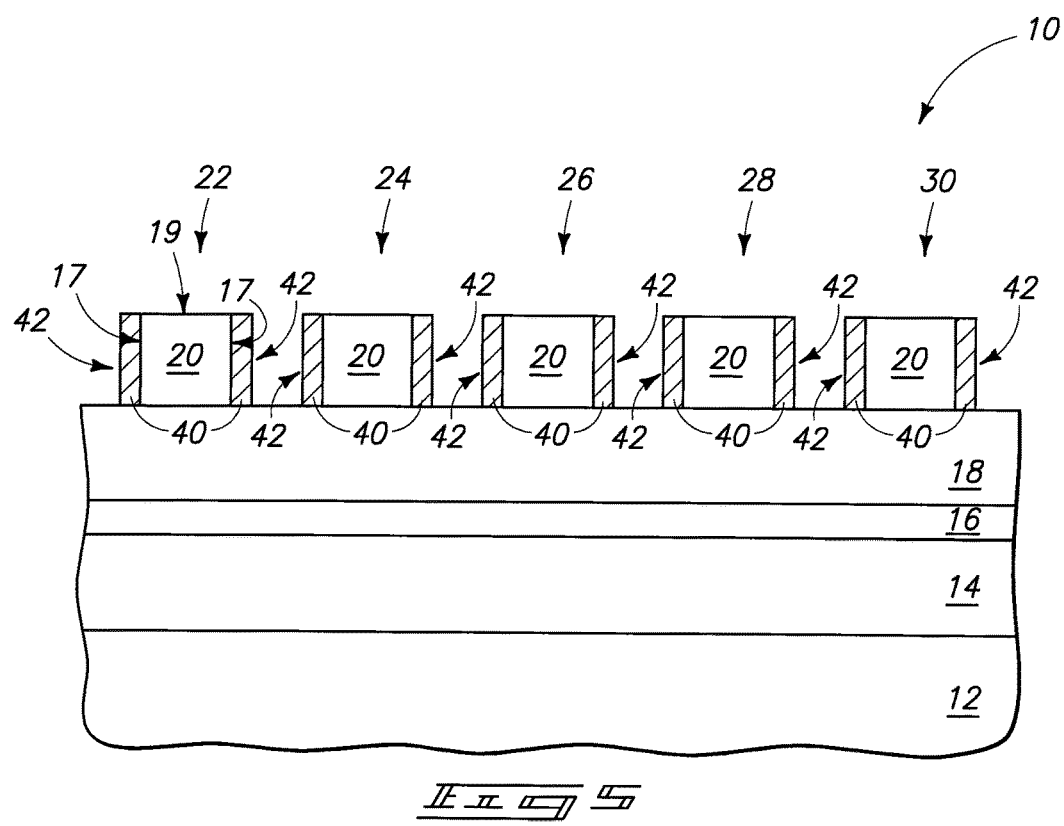
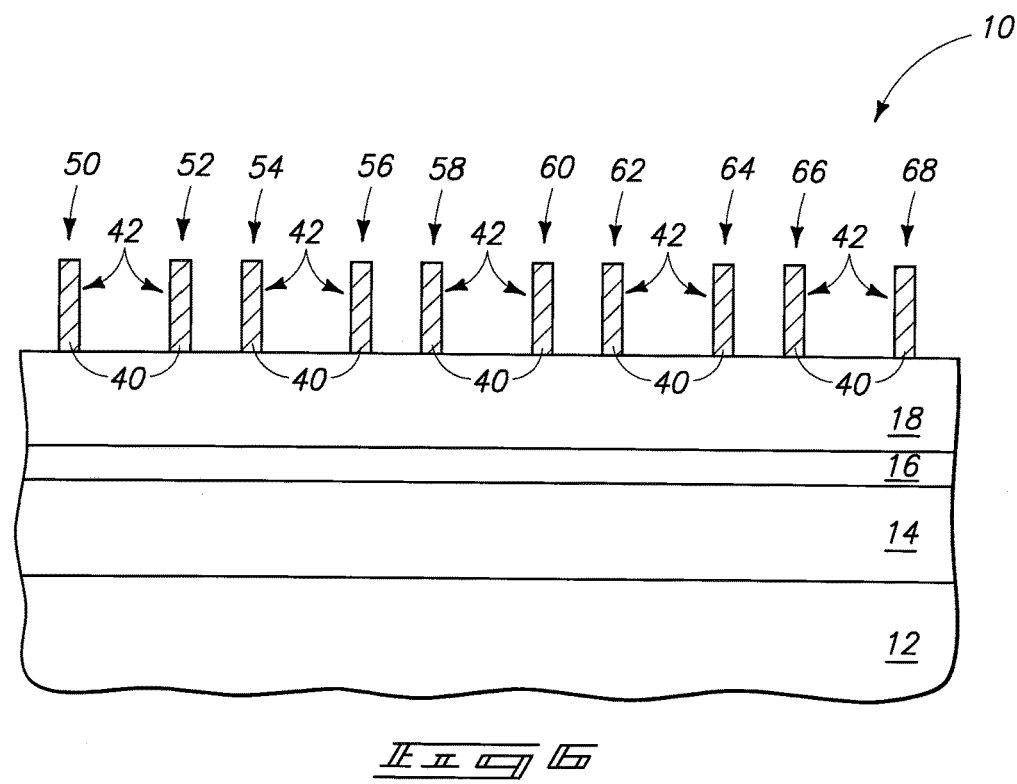

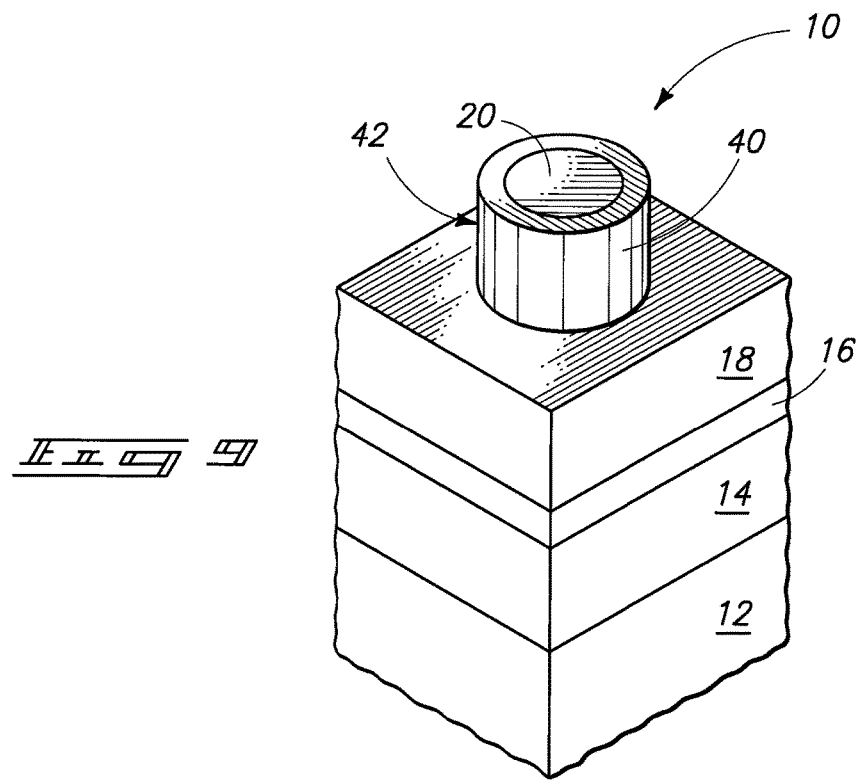
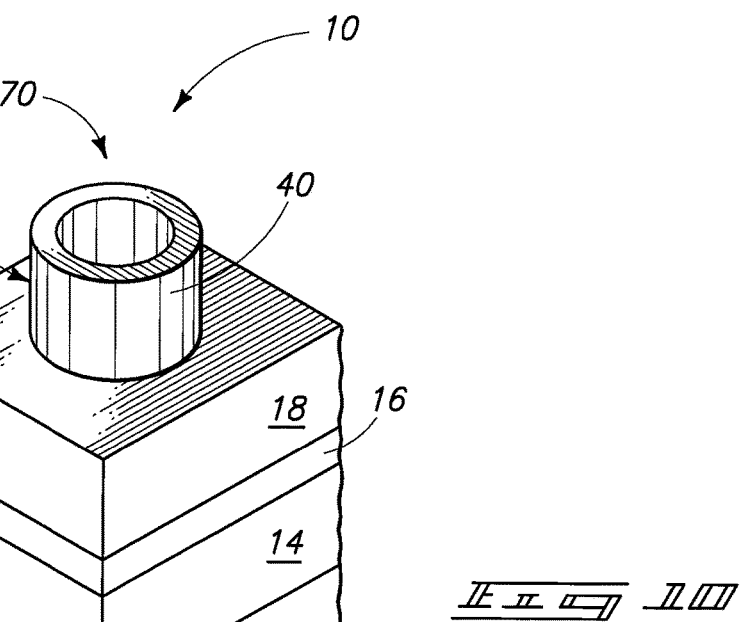

METHODS OF FORMING STRUCTURES SUPPORTED BY SEMICONDUCTOR SUBSTRATES

TECHNICAL FIELD

Methods of forming structures supported by semiconductor substrates.

BACKGROUND

Integrated circuit fabrication may involve formation of a photolithographically-patterned mask over a semiconductor substrate, followed by transfer of a pattern from the mask into one or more materials with one or more etches.

The photolithographically-patterned mask may comprise any suitable radiation-imageable material, such as polyimide or photoresist. A pattern is formed in the radiation-imageable material by subjecting the material to patterned actinic radiation (for instance, ultraviolet light) so that some portions of the radiation-imageable material are exposed to the radiation while other portions are not exposed. Either the exposed or unexposed portions may be selectively removed relative to the other of the exposed and unexposed portions with an appropriate developing solution, thereby creating a pattern in the radiation-imageable material.

A continuing goal of integrated circuit fabrication is to create smaller structures. Numerous difficulties may be encountered in attempting to create smaller structures with traditional photolithographic processing, in that a minimum size achievable by a photolithographic process is imposed by the wavelength of actinic radiation utilized in the process. Modern processes are approaching the limits of scalability imposed by the physical properties of the actinic radiation.

It would be desired to develop new methods of forming patterns for integrated circuit fabrication which can extend the limits of scalability.

BRIEF DESCRIPTION OF THE DRAWINGS

FIGS. 1-7 are diagrammatic, cross-sectional views of a portion of a semiconductor wafer construction shown at various process stages of an embodiment.

FIGS. 8-10 are three-dimensional views of a portion of a semiconductor wafer construction shown at various process stages of an embodiment.

DETAILED DESCRIPTION OF THE ILLUSTRATED EMBODIMENTS

Figure 3:
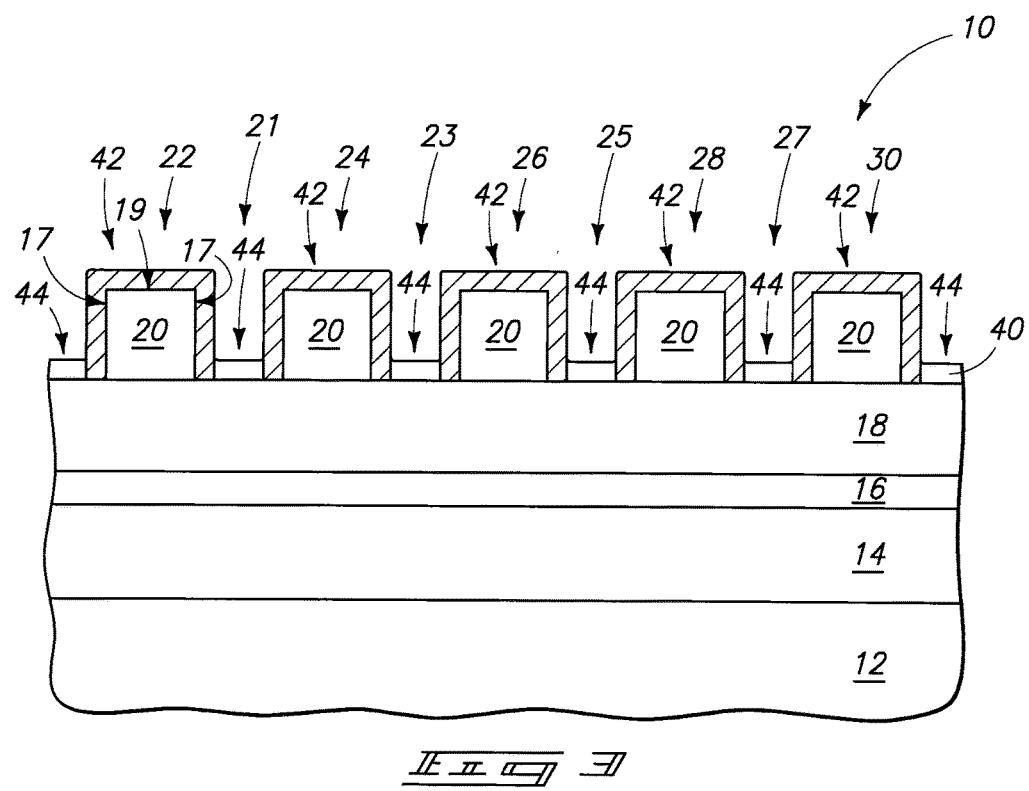

Example embodiments are described with reference to FIGS. 1-10.

Referring to FIG. 1, such illustrates a portion of a semiconductor construction 10. The construction includes a base, or substrate, 12, which may, for example, comprise, consist essentially of, or consist of monocrystalline silicon lightly-doped with background p-type dopant. The terms "semiconductive substrate" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other layers). The term "substrate" refers to any supporting structure, including, but not limited to, the semiconductive substrates described above.

A plurality of materials 14, 16 and 18 are over base 12. The materials may comprise any compositions which may be utilized in forming integrated circuitry. Accordingly, one or more of the materials may comprise an electrically insulative composition (for instance, silicon dioxide, silicon nitride, borophosphosilicate glass, etc.); one or more of the materials may comprise an electrically conductive composition (for instance, metal, metal nitride, metal silicide, conductively-doped silicon, etc.); and/or one or more of the materials may comprise a semiconductor composition (for instance, silicon, germanium, etc.). The materials 14, 16 and 18 may comprise any suitable thicknesses.

A photolithographically patterned radiation-imageable material 20 is over material 18. Material 20 may, for example, comprise, consist essentially of, or consist of photoresist. The material 20 is patterned into a plurality of separate features 22, 24, 26, 28 and 30; and such features are spaced from one another by gaps 21, 23, 25 and 27. Although five separate features are shown, any suitable number of features may be utilized. Generally, there will be at least two separate features, and accordingly there will generally be at least one gap.

In the shown cross-sectional view, each of the features has a pair of opposing sidewalls 17 (only labeled for feature 22) and a top 19 (only labeled for feature 22).

Referring to FIG. 2, a material 40 is formed over the features 22, 24, 26, 28 and 30; and within (or in other words, across) the gaps 21, 23, 25 and 27 between the features. Material 40 may be referred to as a second material to distinguish it from the radiation-imageable material 20.

Material 40 may be similar to a class of materials available from Clariant International, Ltd. as so-called "AZ R" materials, such as the materials designated as AZ R200™, AZ R500™ and AZ R600™.

The "AZ R" materials contain organic compositions which cross-link upon exposure to acid released from chemically-amplified resist. Specifically, an "AZ R" material may be coated across photoresist, and subsequently the resist may be baked at a temperature of from about 100° C. to about 120° C. to diffuse acid from the resist and into the material to form chemical cross-links within regions of the material proximate the resist. Portions of the material adjacent the resist are thus selectively hardened relative to other portions of material that are not sufficiently proximate the resist. The material may then be exposed to conditions which selectively remove the non-hardened portions relative to the hardened portions. Such removal may be accomplished utilizing, for example, 10% isopropyl alcohol in the ionized water, or a solution marketed as "SOLUTION C™" by Clariant International, Ltd. The processes utilizing the "AZ R" materials are sometimes considered examples of RELACS (Resolution Enhancement Lithography Assisted by Chemical Shrink) processes.

A problem with the "AZ R" materials can be that they are similar enough in composition to photoresist that it is difficult to selectively remove photoresist relative to the hardened "AZ R" materials.

Material 40 may be similar to the "AZ R" materials in that it may comprise a similar or identical organic composition which is altered (for instance, forms cross-links) upon exposure to one or more substances (for instance, acid) released from radiation-imageable material when the material is baked. However, unlike the "AZ R" materials, material 40 may also contain one or more components dispersed in the organic composition which are provided to chemically change material 40 relative to radiation-imageable materials (for instance, photoresist) so that the radiation-imageable materials may be selectively removed relative to material 40. The components dispersed in the organic composition of material 40 may include one or more of titanium, carbon, fluorine, bromine, silicon and germanium. The carbon dispersed in the organic composition may be part of a carbide compound so that it is chemically different from the bulk carbon of the organic composition. The fluorine and bromine may be, for example, comprised by hydrofluoric acid and hydrobromic acid. In some embodiments, the components dispersed in the organic composition of material 40 include one or more inorganic components, such as, for example, silicon, germanium, metals (for instance, titanium, tungsten, platinum, etc.) and/or metal-containing compounds (for instance, metal nitride, metal silicide, etc.).

The component of material 40 that is similar to "AZ R" materials may be referred to as an "AZ R"-type composition. Accordingly, in some embodiments material 40 may be considered to have one or more inorganic components dispersed in an organic "AZ R"-type composition.

Material 40 may be formed over and between the features 22, 24, 26, 28 and 30 with any suitable methodology, including, for example, spin coating.

Referring to FIG. 3, construction 10 is subjected to conditions which cause at least one substance to diffuse from material 20 of features 22, 24, 26, 28 and 30 into regions of material 40 proximate such features. The substance alters material 40 to form altered regions 42 proximate the features 22, 24, 26, 28 and 30, and to leave non-altered regions 44 as segments of material 40 that are less proximate the features. The altered regions are designated by cross-hatching in FIG. 3 to emphasize the different regions 42 and 44. The altered regions may be considered together to define an altered portion of material 40, and the non-altered regions may be considered together to define a non-altered portion of material 40.

In some embodiments, material 20 comprises chemically-amplified photoresist, and the substance diffused from such photoresist is acid. The acid is caused to be released from the photoresist by baking construction 10 at a temperature of at least about 100° C. The acid forms cross-links within the "AZ R"-type composition of material 40. The amount of cross-linking, and the distance that the cross-linking spreads from a photoresist feature, may be adjusted by modifying one or both of the bake time and the bake temperature.

Figure 4:
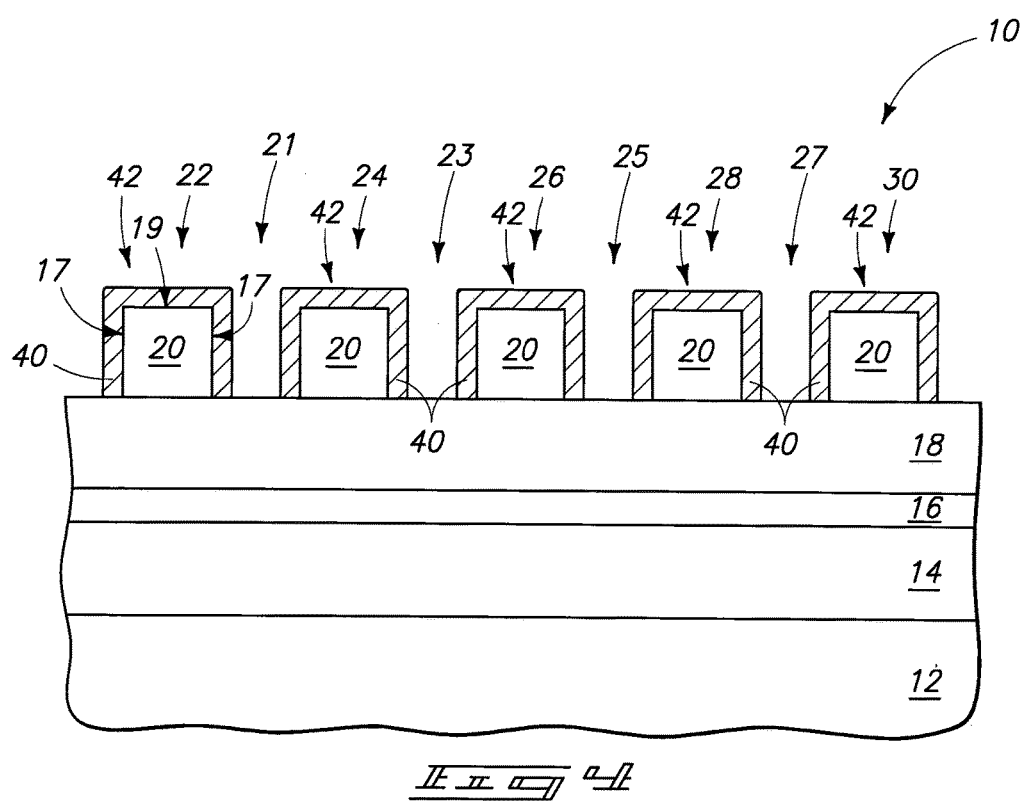

The non-altered regions 44 of material 40 are selectively removable relative to the altered regions 42, and FIG. 4 shows construction 10 after the non-altered regions have been removed. Such removal may be accomplished utilizing isopropyl alcohol and/or SOLUTION C™. As discussed above, material 40 may comprise various additional components (for instance, metal, silicon dioxide, etc.) dispersed in an "AZ R"-type composition. In some embodiments, the additional components may simply rinse away as the non-altered regions of material 40 are removed. In other embodiments, such additional components may be removed with solvent specific for the additional components. For instance, if silicon dioxide is utilized as a component of material 40, hydrofluoric acid may be utilized during removal of the non-altered regions of material 40 to ensure that the silicon dioxide of the non-altered regions is removed in addition to the "AZ R"-type composition of the non-altered regions.

The altered regions 42 of material 40 form caps extending over the tops 19 and sidewalls 17 of features 22, 24, 26, 28 and 30. In some embodiments, the features having the caps associated therewith may be utilized for patterning one or more of underlying materials 14, 16 and 18. In other embodiments, it may be desired to selectively remove radiation-imageable material 20 to leave structures comprising only the altered regions 42 of material 40. A method for selectively removing the radiation-imageable material is described with reference to FIGS. 5 and 6.

Referring to FIG. 5, material 40 is removed from over the tops 19 of features 22, 24, 26, 28 and 30, while leaving material 40 along the sidewalls 17 of such features. The removal of material 40 from over the tops of the features may be accomplished utilizing any suitable processing, including, for example, a directional physical etch and/or chemical-mechanical polishing (CMP).

Referring to FIG. 6, radiation-imageable material 20 (FIG. 5) is removed to leave structures 50, 52, 54, 56, 58, 60, 62, 64, 66 and 68 of the altered regions 42 of material 40 over material 18. Such structures are double-pitch relative to an original pitch of the features 22, 24, 26, 28 and 30 (FIG. 1) of radiation-imageable material 20.

Material 20 (FIG. 5) may be selectively removed relative to altered regions 42 of material 40 due to such altered regions comprising one or more components in addition to an "AZ R"-type composition. For instance, if the additional components are resistant to oxidation, the photoresist may be removed utilizing ashing or another oxidative process. Such process may weaken the regions 42 of material 40 due to removal of some of the "AZ R"-type composition. However, the additional components can form a matrix which remains after removal of at least some of the "AZ R"-type composition from the regions 42 of material 40.

The structures of regions 42 of material 40 may be utilized as a mask. For instance, the structures may be utilized during doping of material 18 to protect a region of the material while another region is doped; and/or the structures may be utilized during one or more etches into one or more of the underlying materials 14, 16 and 18 to define a pattern which is to be formed in such underlying materials.

Figure 7:
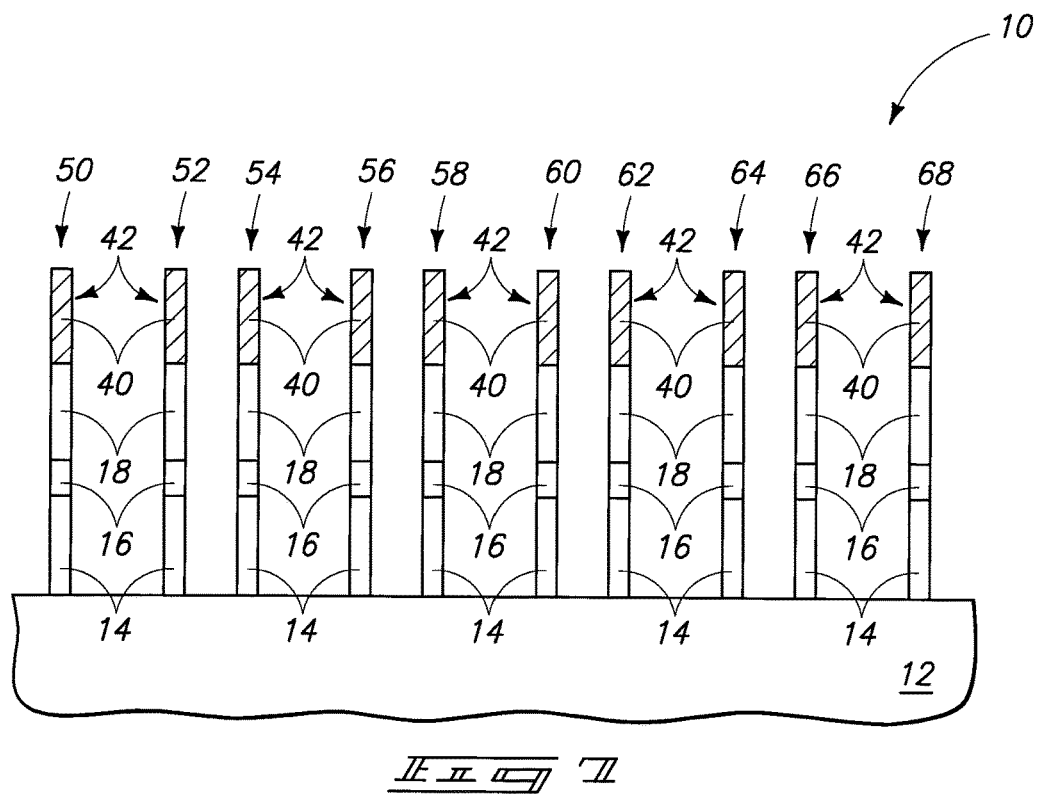

FIG. 7 shows construction 10 after structures 50, 52, 54, 56, 58, 60, 62, 64, 66 and 68 have been utilized as a mask during an etch through underlying materials 14, 16 and 18.

Figure 11:
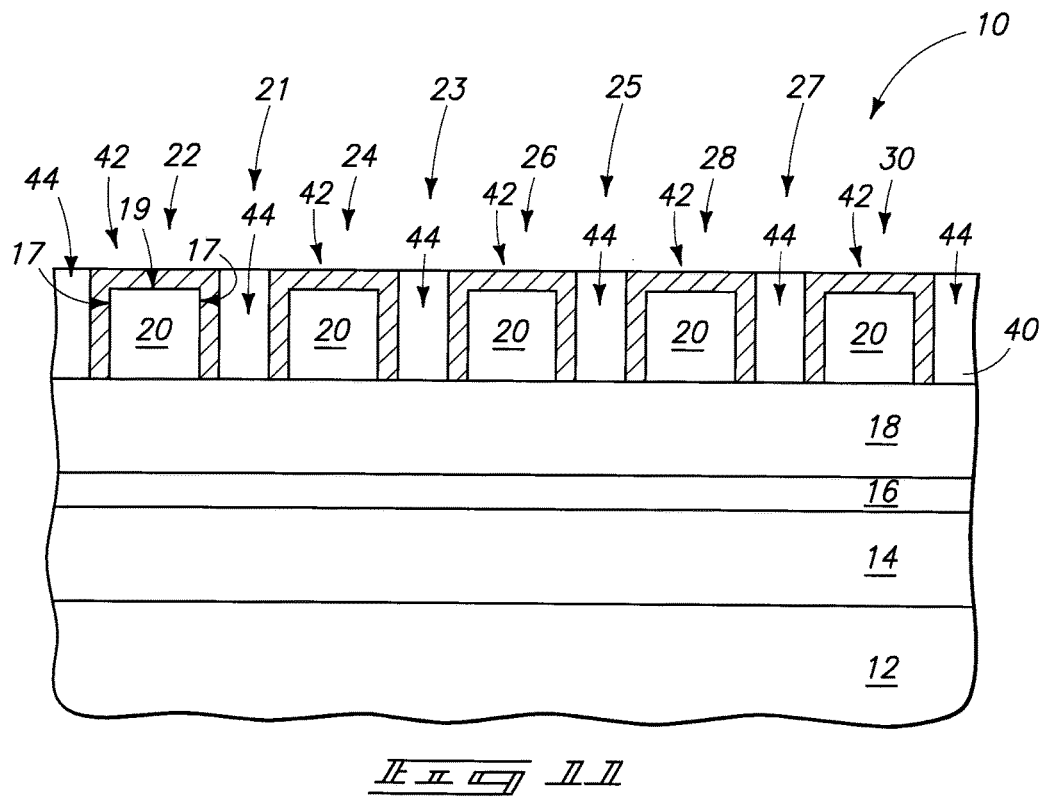
FIGS. 11 and 12 are views of the portion of FIGS. 1-7 shown at various process stages of an embodiment. The processing stage of FIG. 11 follows that of FIG. 1, and the processing stage of FIG. 12 follows that of FIG. 11.
Figure 12:
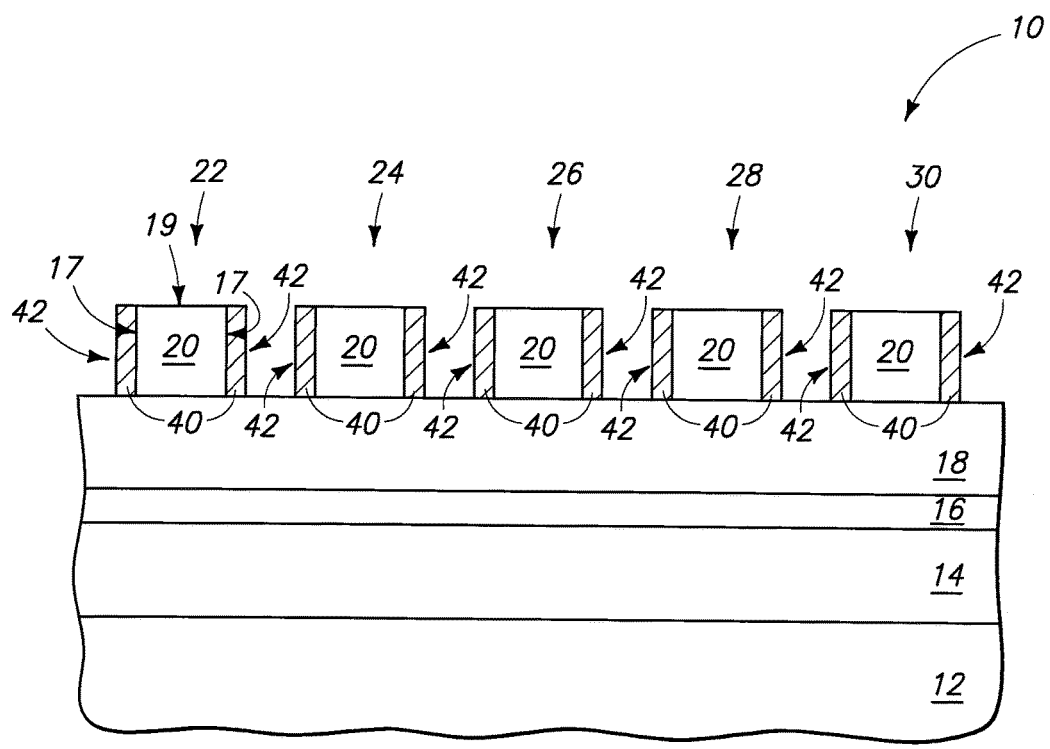

The processing of FIGS. 2-5 utilizes a thin, conformal coating of material 40 (with material 40 being the material that may be an "AZ R"-type composition). In other embodiments, a thick layer of material 40 may be formed to fill gaps 21, 23, 25 and 27, and to cover features 22, 24, 26, 28 and 30. An example of such other embodiments is shown in FIG. 11, where construction 10 is shown at a processing stage subsequent to that of FIG. 1. The structure of FIG. 11 is at a processing stage analogous to that of FIG. 3, and thus material 40 is sub-divided amongst altered regions 42 and non-altered regions 44. In subsequent processing, the non-altered regions 44 and the upper portions of the altered regions 42 may be removed, to form the construction of FIG. 12. The construction of FIG. 12 is identical to that of FIG. 5. The removal of the non-altered regions 44 and the upper portions of the altered regions 42 may comprise two separate steps, analogous to the steps of FIGS. 4 and 5, or may be conducted in a single step.

Figure 8:
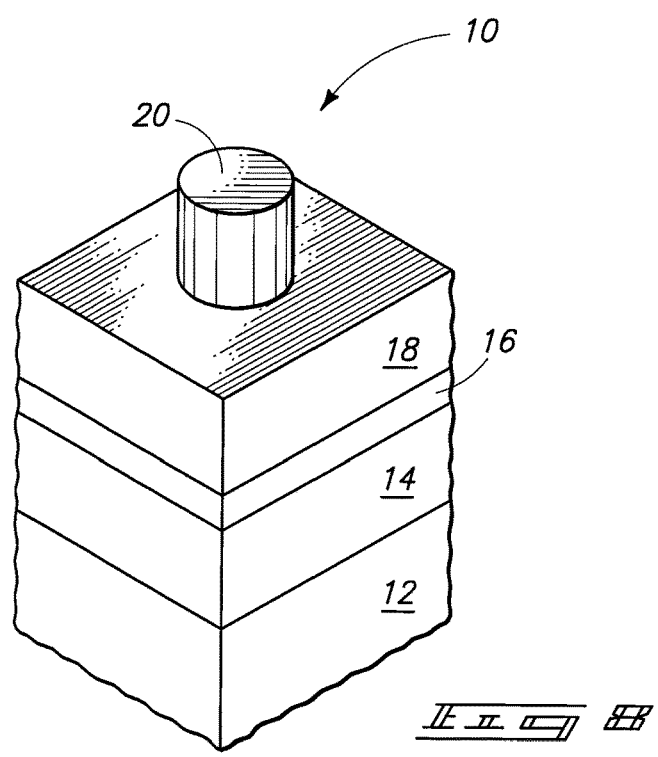

The structures 50, 52, 54, 56, 58, 60, 62, 64, 66 and 68 of FIGS. 6 and 7 are in the form of pedestals in the shown cross-sectional views. Such pedestals may be part of walls (or lines) extending into and out of the page relative to the shown cross-sectional views. Regardless, the pedestals are non-tubular. In other embodiments, methodology similar to that of FIGS. 1-6 may be utilized to form tubular structures. FIGS. 8-10 illustrate an example of an embodiment that may be utilized for forming tubular structures. Similar numbering will be used to describe FIGS. 8-10 as is used above to describe FIGS. 1-6.

Referring to FIG. 8, such shows a three-dimensional view of construction 10 at a processing stage analogous to that of FIG. 1. However, unlike FIG. 1, the radiation-imageable material 20 is shown patterned as a cylinder.

Referring next to FIG. 9, construction 10 is shown at a processing stage subsequent to that of FIG. 8 and analogous to that of FIG. 5. The material 40 has been formed around radiation-imageable material 20 and subjected to processing which forms an altered region 42. Subsequently, the material 40 has been removed from over radiation-imageable material 20 to leave altered region 42 as a tube extending around the cylindrically-shaped radiation-imageable material 20.

Referring next to FIG. 10, material 20 is removed to leave a structure 70 of an altered region 42 of material 40, with structure 70 being a tube (in other words, a hollow cylinder) over material 18. In subsequent processing (not shown), the tube may be utilized to define a masking pattern for doping and/or etching into underlying materials. The shown tube may be representative of a plurality of tubes simultaneously formed over a semiconductor base.

The processing of FIGS. 1-10 may be utilized in any of numerous integrated circuitry fabrication applications. For instance, the processing may be utilized to form FLASH memory or dynamic random access memory (DRAM). The processing may be useful for imaging in the less than 35 nanometer (nm) range; such as imaging from about 10 nm to less than 35 nm.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming structures, comprising:
    forming a radiation-imageable material over a semiconductor substrate;
    photolithographically patterning the radiation-imageable material into at least two separated features; the separated features having one or more gaps between them;
    forming a second material over the at least two separated features, the second material being directly against the radiation imageable material, and across the one or more gaps between the at least two separated features, the second material comprising one or more components dispersed in an organic composition that is crosslinkable upon exposure to acid, the one or more components consisting of inorganic material comprising one or more members of the group consisting of metal silicide, hydrofluoric acid and hydrobromic acid;
    baking the features having the second material thereover to release at least one substance which alters the second material, the altering comprising forming crosslinks within the organic composition; the baking transferring the at least one substance from the features into regions of the second material proximate the features to alter said regions while leaving other regions of the second material non-altered; the non-altered second material being selectively removable relative to the altered second material, and the features being selectively removable relative to the altered material;
    treating the semiconductor substrate with isopropyl alcohol to remove the non-altered regions of the second material relative to the altered regions of the second material, the treating retaining portions of the altered regions of the second material along the sidewalls and over the top of the features;
    after the treating, removing portions of the altered regions of the second material over the top of the features; and
    selectively removing the features relative to the altered regions of the second material to leave at least one structure of the altered regions of the second material.

2. The method of claim 1 wherein the at least one substance released from the features includes acid.

3. The method of claim 1 wherein the one or more components further include silicon.

4. The method of claim 1 wherein the one or more components further include at least one metal.

5. The method of claim 1 wherein:
    the at least one substance released from the features includes acid;
    the altering of said regions comprises forming cross-links within the organic composition upon exposure to the acid released from the features; and
    said one or more components further comprising one or more of titanium, carbon, silicon and germanium.

6. The method of claim 1 wherein the semiconductor substrate comprises a base semiconductor material and one or more materials over said base semiconductor material; and further comprising utilizing said at least one structure of the altered regions of the second material as a mask during an etch into at least one of said one or more materials.

7. A method of forming structures supported by a semiconductor substrate, comprising:
    forming at least two separated photoresist features over a semiconductor substrate;
    forming a material over and in direct contact with the at least two photoresist features, and across one or more gaps between the at least two photoresist features, the material comprising an organic composition that is crosslinkable upon exposure to acid and one or more components, the one or more components including one or both of hydrofluoric acid and hydrobromic acid, the photoresist features being configured to release at least one substance which alters a portion of the material, the altering comprising forming crosslinks within the organic composition; the non-altered material being selectively removable relative to the altered material, and the photoresist features being selectively removable relative to the altered material;
    releasing the at least one substance from the photoresist features and into regions of the material proximate the photoresist features to alter said regions; said regions thereby becoming a portion of the material which is altered while another portion of the material remains non-altered;
    treating the semiconductor substrate to remove regions of the non-altered portion of the material from the gaps between the features while retaining the altered portion of the material along sidewalls and over the top of the features;
    after the treating, removing the altered portion of the material from over the top of the features; and
    selectively removing the photoresist features relative to the altered portion of the material to leave at least one structure of the altered portion of the material over the semiconductor substrate.

8. The method of claim 7 wherein the at least one substance released from the photoresist features includes acid.

9. The method of claim 7 wherein the one or more components include silicon.

10. The method of claim 7 wherein the one or more components include at least metal.

11. The method of claim 7 wherein:
the at least one substance released from the photoresist features includes acid;
the altering of said regions comprises forming cross-links within the organic composition upon exposure to the acid released from the photoresist features; and
said one or more components further including one or more of titanium, carbon, silicon and germanium.

12. The method of claim 7 wherein the semiconductor substrate comprises a base semiconductor material and one or more materials over said base semiconductor material; and further comprising utilizing said at least one structure of the altered portion of the material as a mask during an etch into at least one of said one or more materials.

13. The method of claim 7 wherein said at least one structure of the altered portion of the material comprises a tube.

14. The method of claim 7 wherein said at least one structure of the altered portion of the material comprises a plurality of non-tubular pedestals.

15. A method of forming structures, comprising:
forming a pattern of radiation-imageable material over a semiconductor substrate, the pattern comprising at least two separated features separated from each other by a gap;
forming a second material over the at least two separated features and entirely filling the gap, the second material being directly against the radiation imageable material, the second material comprising one or more components consisting of inorganic material comprising metal silicide dispersed in an organic composition that is cross-linkable upon exposure to acid;
baking the features having the second material thereover to alter the second material, the baking transferring the at least one substance from the features into regions of the second material proximate the features to alter said regions while leaving other regions of the second material non-altered;
treating the semiconductor substrate to remove the non-altered regions of the second material relative to the altered regions of the second material, the treating retaining portions of the altered regions of the second material along the sidewalls and over the top of the features;
after the treating, removing portions of the altered regions of the second material over the top of the features; and
selectively removing the features relative to the altered regions of the second material to leave at least one structure of the altered regions of the second material.

16. The method of claim 15 wherein the forming the second material over the features entirely fills the gap with the second material.

17. The method of claim 15 wherein the at least one substance released from the features includes acid.

18. A method of forming structures, comprising:
forming a radiation-imageable material over a semiconductor substrate;
photolithographically patterning the radiation-imageable material into at least two separated features; the separated features having one or more gaps between adjacent features;
forming a second material over the at least two separated features, the second material being directly against the radiation imageable material, and across the one or more gaps between the at least two separated features; the second material comprising one or more components dispersed in an organic composition, the one or more components being selected from the group consisting of HF, Br, HBr, and metal silicide;
baking the features having the second material thereover to release at least one substance which alters the second material; the baking transferring the at least one substance from the features into regions of the second material proximate the features to alter said regions while leaving other regions of the second material non-altered, the non-altered second material being selectively removable relative to the altered second material, and the features being selectively removable relative to the altered material;
selectively removing the non-altered regions of the second material relative to the altered regions of the second material, the selectively removing comprising treatment with isopropyl alcohol; and
selectively removing the features relative to the altered regions of the second material to leave at least one structure of the altered regions of the second material.

19. The method of claim 18 wherein the altered regions of the second material extends over the photoresist features; and further comprising, prior to the selective removal of the photoresist features relative to the altered regions of the second material, removing portions of altered regions of the second material from over the photoresist features while retaining portions of the altered regions of the second material along sidewalls of the photoresist features.

* * * * *